United States Patent Office 3,357,902

Patented Dec. 12, 1967

3,357,902

USE OF ANODIZING TO REDUCE CHANNELLING ON SEMICONDUCTOR MATERIAL

Eddi Benjamini, San Jose, and Edward F. Duffek, Los Altos, Calif., assignors to Fairchild Camera and Instrument Corporation, Syosset, N.Y., a corporation of Delaware No Drawing. Filed May 1, 1964, Ser. No. 364,751
7 Claims. (Cl. 204—38)

ABSTRACT OF THE DISCLOSURE

The process of making a diffused silicon semiconductor device wherein the conventional thermally grown oxide coating which is normally retained is removed and reformed by anodic deposition. The new anodically deposited coating has much less tendency to induce the formation of channels at the surface.

This invention relates to an improved process for making diffused semiconductor devices having a permanent semiconductor oxide coating on one surface. More particularly, the invention provides an improvement in semiconductor processing wherein the oxide coating on a surface of the device formed during conventional processing is removed and replaced according to this invention by a new oxide coating which greatly reduces the tendency of the device to form undesirable channels on the surface.

Semiconductor devices have customarily been made by a commercial process called the "planar" process. This process is described and claimed in U.S. Patent 3,025,589, assigned to the same assignee as this invention. The process described in the patent uses the same oxide coating both to mask the surface of the device for diffusion, and to permanently protect that surface during and after processing. The planar process has had wide industry acceptance because of the highly stable and reliable devices which result. It has been considered extremely important to permanently protect the junctions extending to the surface of the device by the same oxide coating both during and after manufacturing.

For certain applications, however, these conventional planar semiconductor devices have a tendency to form undesirable channels at the surface. For example, a PNP transistor having a silicon oxide coating upon its planar surface has a tendency to "channel," limiting the maximum voltage at which these devices may be used. Although the complete theory of this channeling is somewhat complex, and is not entirely understood, it is known that the channeling effect causes surface conduction which produces a low resistance current path at the surface. As applied to a planar transistor, channeling occurs from the base region across the passivated surface of the collector region to an unprotected edge of the transistor. In a diode, channeling occurs in substantially the same way on the surface. The channeling causes an unexpectedly high leakage current, and may actually nullify certain advantages of planar transistors and diodes. The channeling effect is particularly bothersome in diffused silicon devices with P-type regions at the surface, such as for example, high voltage PNP transistors. The effect of this channeling is the same as if a shallow N-type region were induced across portions of the collector surface, thereby effectively extending the base-collector junction to the edge of the transistor.

This invention provides an improved process for making planar semiconductor devices wherein it is particularly important to reduce or eliminate the "channeling" effect. Accordingly, this invention provides an improvement in the process for making diffused silicon semiconductor devices having at least one diffusion step resulting in the growth of a coating of the oxide of the semiconductor material on the surface of the semiconductor wafer. This improvement, useful in making more stable semiconductor devices, comprises removing the grown oxide from the surface of the semiconductor material by etching and thereafter anodically depositing in a substantially nonaqueous electrolyte a new coating of an oxide of a semiconductor material on that surface, the new coating having much less tendency to induce the formation of channels at the surface of the wafer. Thus, in contradiction to the conventional practice in the art of leaving the same oxide coating on the surface of the device during and after processing, this invention removes the oxide coating after diffusion has been completed, but before metallization, and replaces that coating with a new oxide having much less tendency to induce the formation of channels, according to the invention. The invention is most applicable to lightly doped (i.e., less than $10^{17}$ atoms/cc.) P-type silicon surfaces covered with the grown oxide. The particular method of this invention used to form the new oxide is described below.

In somewhat more detail, a wafer is put through the conventional diffusion steps of transistor processing, as described in U.S. Patent 3,025,589. In this way, transistors, diodes, or integrated circuits are formed in the wafer. A single wafer usually contains more than one such device, generally hundreds or thousands. Such a wafer, for example a silicon wafer, is separated into single devices later, after the formation of the devices has been completed. After the diffusion step, the wafer contains a layer of thermally grown silicon dioxide, as described in the above patent, usually between about one thousand and ten thousand angstroms thick. Contrary to conventional semiconductor processing, in this process, this oxide is then removed. The removal can be accomplished by dipping the wafer for a short period of time, e.g., from about 10–60 seconds, in a hydrofluoric acid solution. Such a solution is usually reagent concentration, i.e., about 48 percent by volume hydrofluoric acid. This dip is sufficient to remove the oxide. The wafer is then washed in deionized water, and then dried in any conventional manner.

The new oxide is formed at this stage in the processing. This is accomplished by a process termed anodic oxidation. The wafer is connected as the anode and immersed in a solution of an electrolyte. A conventional cathode, such as platinum or the like, is used. The entire oxidation process is carried out at about room temperature (25°–35° C.).

The solution conventionally employed in the prior art, as shown in U.S. Patent 2,909,470, employs N-methylacetamide (NMA) as the solvent. Included in the solution is a minor amount of an oxygen-containing substance which is soluble in the solvent. However, for the purposes of this invention, wherein a wafer is being oxidized which already has semiconductor devices formed by diffusion within it, a different solvent has been discovered to provide improved results. This solvent is a glycol of the generic formula $OH—(CH_2)_n—OH$, wherein $n$ is at least 2, preferably from 2 to 6. Although higher orders of $n$ may be used, the solubility of the oxygen-containing salt is somewhat limited in higher order glycols. For example, ethylene glycol, propane 1,3-diol, butane 1,4-diol, pentane 1,5-diol, and hexane 1,6-diol have been found satisfactory. An oxygen-containing substance is also added to this solution. The oxygen-containing substance can be an alkali metal salt having an oxygen-containing anion. Alternatively, water may be used in the solution as the oxygen-containing substance. Reagent grade glycols normally contain small amounts (0.1–1.0%) water. It is also possible to use a combination of water and an oxygen-containing salt. It has been found that the best quality oxide layers are produced when the water content in the solution is maintained between about 0.5 to 5.0 percent by weight water preferably between about 0.8 to 2.0 percent.

With the wafer connected as the anode, a current is passed through the solution between cathode and anode. An improvement in the process of this invention arises from maintaining the current substantially constant during anodization. The current density required is generally between about 5 and 15 milliamperes (ma.) per square centimeter of wafer surface area to be oxidized. Although the voltage tends to increase with time during oxidation, the current is maintained constant. Automatically regulated power supplies, conventionally available, may be used for this purpose.

By monitoring the voltage changes during oxidation, an indication is given of the thickness of the oxide being formed on the wafer. It has been found that a voltage of 75 volts generally means an oxide thickness of about 500 A. has been formed; 180 volts means 1000 A.; and 270 volts means 1500 A. The voltage corresponding to any desired thickness may be established empirically without difficulty. It is then only necessary to oxidize the wafer according to the invention until the voltage reaches the predetermined voltage, and the desired oxide thickness will have been obtained. At that time, if desired, the current need no longer be kept constant, and may be allowed to drop to about one-tenth of its previously maintained value before removing the wafer from the solution.

After the oxidation has been completed, the wafer is again washed in deionized water and dried. The conventional semiconductor processing is then continued. For example, apertures may be etched in the oxide surface for the formation of contacts. The entire surface is then covered by evaporated metal, and unwanted portions are etched away to leave the desired contact or interconnection pattern, according to the teachings of U.S. Patent 3,108,359, assigned to the same assignee as this invention. In the case of integrated circuits, interconnections between various devices on the chip may be made by similar techniques, as described in U.S. Patent 2,981,877, assigned to the same assignee as this invention.

The advantages of the invention, as described above, may be easily observed from the following comparative example. It must be remembered, when reading the example, that only a single preferred embodiment of the invention is described. Accordingly, the example is not intended to limit the scope of the invention as set forth in the appended claims.

*Example*

Two PNP transistors were fabricated according to the process described in U.S. Patent 3,025,589. One of the wafers, however, after the formation of the junctions by diffusion, but prior to the etching of openings for the subsequent attachment of the ohmic contacts, was subjected to the process of this invention. Accordingly, the oxide layer formed during the diffusion operation was removed by dipping the wafer in a 48 percent (by volume) solution of hydrofluoric acid. After washing and drying, the wafer was connected to the anode of an electrolysis apparatus. A platinized tantalum cathode was used. Anode and cathode were immersed in a solution of pure reagent ethylene glycol. Included in the solution was sufficient potassium nitrate to bring the solution to 0.04 N. A constant 40 ma. current was maintained between anode and cathode for 15 minutes (calculated to be 8 ma. per square centimeter of wafer area). The starting voltage between anode and cathode was 28 volts; at the end of the 15 minute oxidation time, the voltage was 268 volts. At that time, the reaction was allowed to continue, but the current was no longer maintained constant. Accordingly, the current was allowed to drop to one-tenth of its original value, or to about 4 ma. The solution was continuously ultrasonically agitated during the entire reaction. 1,450 angstroms of silicon oxide was produced in the process. The wafer was then rinsed in deionized water and dried.

Both wafers, the one which was not subjected to the process of this invention, and the one which was, were then etched to provide openings in the oxide on the top surface for ohmic contacts to the base and emitter regions. Ohmic contacts were then attached to each device on both wafers. Each wafer was cut into individual devices, leads attached to the electrodes, and all the devices electrically tested. The parameter measured was the reverse collector-base current ($I_{cbo}$, the greater the extent of the channel formation.

48 PNP transistors from each wafer (one wafer having been made according to this invention, and the other according to the prior art) were electrically tested. Initially, the median $I_{cbo}$ for the units of the prior art was 10 times the median $I_{cbo}$ for the units of this invention. After 288 hours of continuous testing, the median $I_{cbo}$ of the units of the prior art was 25 times the median $I_{cbo}$ for the units of the invention. The above electrical test clearly demonstrated that the process of this invention provides a substantial improvement in the tendency of the devices to form undesirable channels.

As will be apparent to one skilled in the art, many modifications may be made in the details of this invention without departing from its spirit and scope. Accordingly, the only limitations to be placed on the scope of this invention are those specifically stated in the claims which follow.

What is claimed is:

1. In the process for making diffused silicon semiconductor devices having a permanent semiconductor oxide coating on one surface thereof, said process including at least one diffusing step which results in the growth of a coating of oxide of the semiconductor material on said surface, the improvement which comprises removing said grown oxide from said surface of said semiconductor material by etching and thereafter anodically depositing in a substantially non-aqueous electrolyte a new coating of an oxide of a semiconductor material, the new coating having much less tendency to induce the formation of channels at said surface.

2. The emprovement of claim 1 further characterized by said non-aqueous electrolyte comprising a non-aqueous solvent and an oxygen-containing substance.

3. The improvement of claim 2 further characterized by said oxygen-containing substance being water.

4. In the process for making diffused silicon semiconductor devices having a permanent semiconductor oxide coating on one surface thereof, said process including at least one diffusion step which results in the growing of a coating of oxide of the semiconductor material on said surface, the improvement which comprises removing said grown oxide from said surface of said semiconductor material by etching and thereafter immersing said device in a substantially non-aqueous electrolyte solution and anodically depositing a new coating of an oxide of a semiconductor material, the new coating having much less tendency to induce the formation of channels at said surface.

5. The improvement of claim 4 further defined by the solvent of said electrolyte solution being a glycol of the generic formula $OH—(CH_2)_n—OH$ wherein *n* is at least 2.

6. The improvement of claim 5 wherein *n* is from 2 to 6.

7. The improvement of claim 4 further defined by the step of maintaining said solution at room temperature.

References Cited

UNITED STATES PATENTS

| | | | |
|---|---|---|---|
| 2,818,374 | 12/1957 | Certa et al. | 204—14 |
| 2,820,745 | 1/1958 | Von Bichowsky | 204—14 |
| 3,100,329 | 8/1963 | Sherman | 29—25.31 |
| 3,281,915 | 11/1966 | Schramm | 20—25.3 |
| 3,282,809 | 11/1966 | Cernes et al. | 204—37 |

HOWARD S. WILLIAMS, *Primary Examiner.*

JOHN H. MACK, *Examiner.*

W. VAN SISE, *Assistant Examiner.*